United States Patent [19]

Lazzarini et al.

[11] Patent Number: 4,864,722
[45] Date of Patent: Sep. 12, 1989

[54] LOW DIELECTRIC PRINTED CIRCUIT BOARDS

[75] Inventors: Donald J. Lazzarini, Binghamton; John P. Wiley, Vestal; Robert T. Wiley, Binghamton, all of N.Y.

[73] Assignee: International Business Machines Corporation, Armonk, N.Y.

[21] Appl. No.: 168,928

[22] Filed: Mar. 16, 1988

[51] Int. Cl.⁴ .......................... H05K 3/36; H05K 1/14
[52] U.S. Cl. ...................................... 29/830; 361/414; 174/68.5; 333/238
[58] Field of Search .................. 29/830; 174/68.5, 36; 361/412, 414; 428/901; 333/238.1

[56] References Cited

U.S. PATENT DOCUMENTS

| | | | |
|---|---|---|---|
| 3,305,416 | 2/1967 | Kahan et al. | 156/3 |
| 3,795,047 | 3/1974 | Abolafia et al. | 29/830 X |
| 3,972,755 | 8/1976 | Misfeldt | 156/3 |
| 4,299,873 | 11/1981 | Ogihara et al. | 428/901 X |
| 4,526,835 | 7/1985 | Takahashi et al. | 428/901 X |
| 4,591,659 | 5/1986 | Leibowitz | 174/68.5 |
| 4,640,866 | 2/1987 | Suzuki | 428/901 X |
| 4,644,093 | 2/1987 | Yoshihara et al. | 174/36 |
| 4,661,301 | 4/1987 | Okada et al. | 264/91 |
| 4,675,789 | 6/1987 | Kuwabara et al. | 361/414 |
| 4,710,854 | 12/1987 | Yamada et al. | 174/68.5 X |
| 4,747,897 | 5/1988 | Johnson | 156/148 |
| 4,755,783 | 7/1988 | Fleischer et al. | 336/84 C |
| 4,755,911 | 7/1988 | Suzuki | 174/68.5 X |

OTHER PUBLICATIONS

IBM Tech Discl. Bull, vol. 13, No. 7, Dec. 1970, p. 2075 by J. R. Cannizarro et al.
IBM Tech Discl. Bull, vol. 13, No. 8, Jan. 1971, p. 2296 by B. H. Archer et al.
IBM Tech Discl. Bull, vol. 22, No. 5, Oct. 1979, p. 1799 by F. W. Haining et al.
A High-Speed Substrate for the Cyber 205 Supercomputer, Circuits Manufacturing, Apr. 1984.

Primary Examiner—Howard N. Goldberg
Assistant Examiner—Carl J. Arbes
Attorney, Agent, or Firm—Pollock, Vande Sande & Priddy

[57] ABSTRACT

The invention features a method of fabricating a printed circuit board with low dielectric materials using a modular technique. Sub-assemblies are first constructed, tested, and then subsequently incorporated into the final circuit board assembly which has a triplate geometry. Dielectric materials are chosen which enhance the performance of the circuit board.

29 Claims, 1 Drawing Sheet

LOW DIELECTRIC PRINTED CIRCUIT BOARDS

FIELD OF THE INVENTION

The invention relates to a fabrication technique for constructing high performance circuit boards, and more particularly to a modularized process for assembling printed circuit boards having a triplate geometry from sub-assemblies.

BACKGROUND OF THE INVENTION

High density printed circuit boards are generally constructed with several electrically conductive layers separated by dielectric layers. Some of the conductive layers are used to supply power and ground voltages. The remaining conductive layers are patterned for electrical signal interconnections among integrated circuit chips. Layer-to-layer interconnections are achieved by means of through-holes plated with electrically conductive material. In high density printed circuit boards it has been normal practice to provide interconnections between adjacent conducting layers, which interconnections are commonly known as "vias".

In U.S. Pat. No. 3,740,678; entitled: Strip Transmission Line Structures; issued: June 19, 1963, a triplate circuit board construction is shown in which X-Y signal planes form a repeating basic core structure in a multi-laminated, high density circuit board.

Such a circuit board construction has been useful in transmitting high frequency signals, and relies upon alternating dielectric mediums to achieve its many benefits.

One of the dielectric sheets comprises an epoxy glass having a relatively high dielectric constant.

Such a material is useful in providing structural stability to the other dielectric sheet of the core which comprises FEP Teflon material or polyethylene, which provide more desirable electrical characteristics.

The aforementioned triplate construction has several drawbacks: (1) it is not a true triplate configuration in which X-Y signal planes are disposed about a conductive power or reference plane (although true triplate constructions have been achieved by other fabrication techniques, they have not been successful in providing such constructions with low dielectric materials); (2) there is no teaching in the above-mentioned patent how vias can be fabricated between individual signal planes embedded as a core within the multi-laminated board structure; (3) it would be more desirable to replace the epoxy-glass resin layers of the patented structure with dielectric materials having lower dielectric constants, without jeopardizing the structural strength of the circuit board assembly; (4) if an electrical short should develop within any one of the cores of the assembly, the whole assembly must be discarded. Such electrical short circuits occur with greater prevalence in high performance circuit boards as layers become thinner and signal line density is increased.

SUMMARY OF THE INVENTION

The invention features a method of fabricating high performance printed circuit board assemblies comprising at least two laminated circuitized power plane sub-assemblies. The circuitized power plane sub-assemblies are modular in that they are fabricated in a prior assembly process, and then laminated to other assembly elements as a finished core unit.

One of the advantages to using this type of fabricating technique is that each modular unit can be tested for electrical integrity prior to its integration into the final assembly. Defective circuit board sub-assemblies can be discarded rather than having to discard the completed assembly, as with present techniques. The invention thus provides less waste, and improves reliability.

The assembly of the invention is of true triplate construction, consisting of two laminated sub-assemblies characterized by spaced-apart X-Y signal planes disposed about two internal power planes. Vias run through the core where necessary to provide communication between the X and Y signal planes.

The triplate core is prefabricated as follows:

(i) a first core comprising a sheet of an electrical conductor disposed on either side of a dielectric layer is circuitized with a power distribution pattern;

(ii) next, a second core is circuitized, the same as, or similar to the first;

(iii) the first and second cores are then laminated together with their power distribution patterns facing each other, in order to form a sub-assembly; and (iv) the sub-assembly is then circuitized to provide a signal plane on either side thereof.

Plated vias are fabricated in the sub-assemblies where necessary.

The initial cores can have a layer of dielectric material with a low dielectric constant of less than 3.0, and preferably in the range of between 1.4 and 3.0. A suitable dielectric material for this purpose can comprise polytetrafluoroethylene.

Normally a core having a flexible dielectric such as polytetrafluoroethylene would be difficult to process into a finished sub-assembly, but the side sheets of conductive material, such as copper, lend structural stability to the core.

The modularization allows each sub-assembly to be fabricated at lower temperatures, despite the fact that the dielectric layers comprise polytetrafluoroethylene.

Still another advantage of the modular technique of the invention is provided by the greater choice of laminating materials. For example, it is intended to reduce the overall dielectric character of the final assembly by laminating the sub-assemblies together using bonding films or a brominated epoxy resin, rather than a glass resin.

High performance is achieved by using the lower dielectrics, which in turn allows for thinner layers and increased wiring density.

These and other advantages and objectives will be better understood with reference to the following detailed description considered in conjunction with the accompanying drawings.

DETAILED DESCRIPTION OF THE INVENTION

Figures 1, 2, 3, 4, 5:
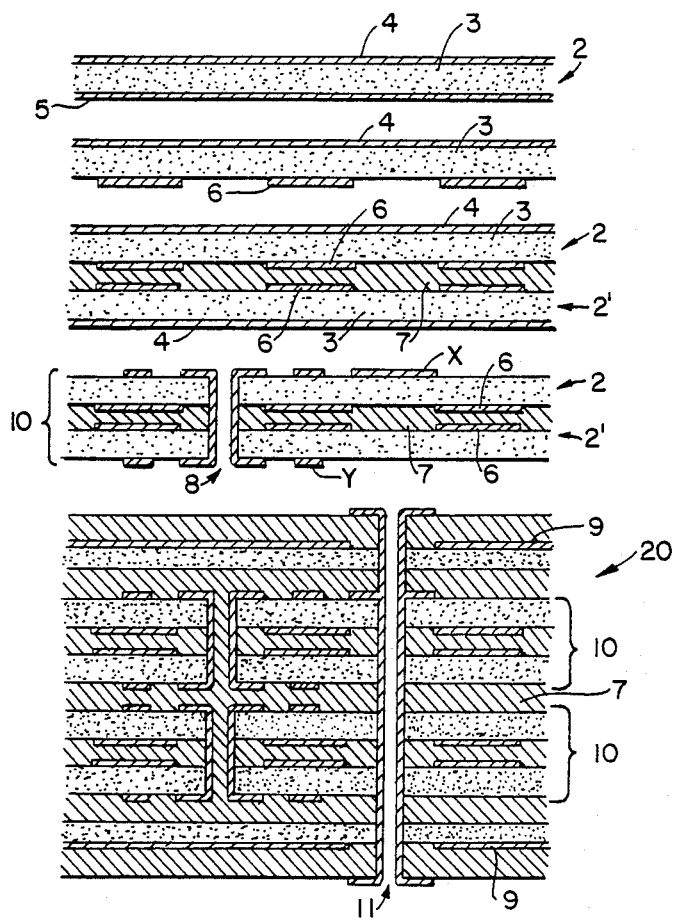
FIG. 1 is a partial sectional view of a raw core for use in fabricating the modular sub-assembly of the invention.
FIG. 2 shows a partial sectional view of the raw core of FIG. 1, after being circuitized with a power pattern.
FIG. 3 depicts a partial sectional view of an uncircuitized sub-assembly, formed by the lamination of two cores of the type illustrated in FIG. 2.
FIG. 4 is a partial sectional view of a finished sub-assembly.
FIG. 5 illustrates a final printed circuit board assembly utilizing within its construction two sub-assemblies of FIG. 4, which have been laminated together.

In general, the printed circuit board of this invention is constructed using many of the same materials and processes outlined and described in U.S. Pat. No. 4,448,804, issued: May 15, 1984 to Amelio et al, which teaches a technique for plating copper to non-conductive surfaces, such as dielectric materials; U.S. Pat. No. 4,030,190, issued: June 21, 1977 to Varker, which describes a method of forming multilayered printed circuit boards; and U.S. Pat. No. 3,523,037, issued: Aug. 4, 1970 to Chellis, which illustrates a method of fabricating laminate boards that are used to construct multilayered assemblies.

For the sake of brevity, it is desired to incorporate herein, the teachings and description of these materials and processes from the aforementioned patents, all of which are hereby incorporated by reference.

Generally speaking, the invention pertains to a modular technique for fabricating high performance circuit board assemblies.

The assembly has a triplate geometry and comprises modular units having X and Y signal planes disposed on either side of two centralized power planes.

Each sub-assembly has its own vias communicating between the X and Y signal planes, such that when these modular units are laminated into the final circuit board assembly, these vias form internal communicating ducts.

For the purposes of clarity, like elements will have the same designation throughout the figures.

Now referring to FIG. 1, a raw core is shown in partial sectional view by arrow 2. The raw core 2 is comprised of an inner layer 3 of a dielectric material having a low dielectric constant of less than 3.0, and preferably in a range of 1.4 to 3.0. Such a suitable material may be polytetrafluoroethylene. Layered on either side of layer 3 are copper sheets 4 and 5, respectively. In order to fabricate a modular sub-assembly 10 as shown in FIG. 4, the raw core 2 is first etched on one of the two copper sides 4 or 5, respectively, with a power pattern 6, as illustrated in FIG. 2.

This etching step is repeated for another similar raw core 2', which can be a mirror image of core 2. The two etched cores 2 and 2' are then laminated together, as shown in FIG. 3, by means of a sticker sheet 7. Sheet 7 can comprise a bonding film or a brominated epoxy resin. A low dielectric bonding material is selected to reduce the overall dielectric character of the sub-assembly, shown by the bracket 10 in FIG. 4. The cores 2 and 2' are bonded together with their respective power patterns 6 facing each other.

The sub-assembly 10 is achieved by circuitizing the outer sheets 4 of the laminated cores 2 and 2', respectively of FIG. 3, with a respective X and Y signal pattern, as depicted in FIG. 4. Appropriate vias 8 are formed in the sub-assembly 10 where needed.

The circuitizing of sheets 4 is accomplished by additive or subtractive techniques known in the art.

Referring to FIG. 5, a final circuit board assembly is illustrated by arrow 20.

The circuit board assembly 20 comprises at least two sub-assemblies 10, as shown. Sub-assemblies 10 can be laminated together by a sticker sheet 7 of low dielectric-strength bonding material.

Reference planes 9 can be laminated about the joined sub-assemblies 10, and appropriate plated through-holes 11 will be added to complete assembly 20.

One of the advantages of constructing an assembly 20 by the modularized method of this invention is the ability to electrically test each sub-assembly 10 before it is laminated into the final circuit board assembly 20. In this manner, only defective sub-assemblies 10 are discarded, rather than entire assemblies 20.

Except for the special methodology of the modularized technique of this invention, all construction steps used herein are within the state of the art. Obvious variations or modifications which would be within the inventive scope, are considered to be part of the invention, as presented by the subsequently appended claims.

Lower temperature processes will become feasible despite the use of materials normally requiring high temperature processes. The use of thinner and more flexible materials will also be possible, with the use of the modularized technique of this invention.

The modularized sub-assemblies provide a greater structural stability to the fabrication, which would not ordinarily be possible with standard construction practices.

Having described the invention, what is desired to be protected by Letters Patent is presented by the following claims.

What is claimed is:

1. A high performance printed circuit board assembly comprising at least two circuitized power plane sub-assemblies adjacently laminated to each other wherein each of said sub-assemblies is characterized by signal planes disposed about two internal power planes facing each other, each of said sub-assemblies having a dielectric between said signal and power planes having a dielectric constant of approximately less than 3.0 and vias disposed within each sub-assembly for providing electrical communication between said signal planes.

2. The high performance printed circuit board assembly of claim 1, wherein said dielectric has a dielectric constant in a range approximately between 1.4 and 3.0.

3. The high performance printed circuit board assembly of claim 1, wherein said dielectric comprises polytetrafluoroethylene.

4. The high performance printed circuit board assembly of claim 1, wherein each circuitized power plane sub-assembly is of modular construction.

5. The high performance printed circuit board assembly of claim 1, wherein said two sub-assemblies are adjacently laminated to each other by a bonding film.

6. The high performance printed circuit board assembly of claim 1, wherein said two sub-assemblies are adjacently laminated to each other by a brominated epoxy resin.

7. A high performance printed circuit board assembly, comprising at least two modular sub-assemblies adjacently laminated together, each of said modular sub-assemblies characterized by a signal plane disposed on opposite sides of two internal power planes that face each other and electrically communicating by means of vias formed within each respective sub-assembly.

8. The high performance printed circuit board assembly of claim 7, wherein said two modular sub-assemblies are adjacently laminated together by a bonding film.

9. The high performance printed circuit board assembly of claim 7, wherein said two modular sub-assemblies are adjacently laminated together by a brominated epoxy resin.

10. A method of constructing a high performance printed circuit board assembly utilizing a modular construction technique comprising the steps of:
   (a) fabricating a number of circuitized power plane sub-assemblies, each respective sub-assembly characterized by a signal plane disposed on opposite sides of two internal power planes facing each other, each of said sub-assemblies having a dielectric between said signal and power planes, and electrically communicating by means of plated vias where necessary; and
   (b) laminating at least two sub-assemblies together to form a composite; and
   (c) constructing a printed circuit board assembly by building a multi-laminate structure using said composite.

11. The method of constructing a high performance printed circuit board assembly in accordance with claim 10, further comprising the step of:
   (d) testing each respective sub-assembly for electrical integrity prior to the laminating step (b).

12. The method of constructing a high performance printed circuit board assembly in accordance with claim 10, wherein the fabrication of each sub-assembly of step (a) further comprises the steps of:
   (i) circuitizing with a power distribution pattern one side of a first core comprising a sheet of an electrical conductor disposed on either side of a dielectric layer;
   (ii) circuitizing a second core similar to step (i);
   (iii) laminating said first and second cores together with said power distribution patterns facing each other to form a sub-assembly; and
   (iv) circuitizing said sub-assembly to provide a signal plane on either side thereof.

13. The method of constructing a high performance printed circuit board assembly, in accordance with claim 12, further comprising the step of:
   (v) fabricating plated vias in said sub-assembly where necessary.

14. The method of constructing a high performance printed circuit board assembly in accordance with claim 13, further comprising the step of:
   (vi) testing said sub-assembly for electrical integrity.

15. The method of constructing a high performance printed circuit board assembly in accordance with claim 12, wherein the laminating of the first and second cores together in step (iii) includes the use of a bonding film.

16. The method of constructing a high performance printed circuit board assembly in accordance with claim 12, wherein the laminating of the first and second cores together in step (iii) includes the use of a brominated epoxy resin.

17. The method of constructing a high performance printed circuit board assembly in accordance with claim 10, wherein the laminating step (b) comprises the use of a bonding film for laminating said sub-assemblies.

18. The method of constructing a high performance printed circuit board assembly in accordance with claim 10, wherein the laminating step (b) comprises the use of a brominated epoxy resin for laminating said sub-assemblies.

19. A method of constructing a high performance printed circuit board assembly utilizing a modular construction technique, comprising the steps of:
   (a) fabricating a first circuitized power core sub-assembly having X-Y signal planes disposed about two internal power planes facing each other and separated therefrom by means of a dielectric layer having a dielectric constant of less than 3.0;
   (b) repeating step (a) to form a number of sub-assemblies the same or similar to said first circuitized power core sub-assembly;
   (c) laminating at least two sub-assemblies together to form a composite; and
   (d) constructing a printed circuit board assembly by building a multi-laminate structure using said composite.

20. The method of constructing a high performance printed circuit board assembly in accordance with claim 19, further comprising the step of:
   (e) testing each respective sub-assembly for electrical integrity prior to the laminating step (c).

21. The method of constructing a high performance printed circuit board assembly in accordance with claim 19, wherein the fabrication of each sub-assembly of step (a) further comprises the steps of:
   (i) circuitizing with a power distribution pattern one side of a first core comprising a sheet of an electrical conductor disposed on either side of a dielectric layer;
   (ii) circuitizing a second core in accordance with step (i);
   (iii) laminating said first and second cores together with said power distribution patterns facing each other to form a sub-assembly; and
   (iv) circuitizing said sub-assembly to provide a signal plane on either side thereof.

22. The method of constructing a high performance printed circuit board assembly, in accordance with claim 21, further comprising the step of:
   (v) fabricating plated vias in said sub-assembly where necessary.

23. The method of constructing a high performance printed circuit board assembly in accordance with claim 22, further comprising the step of:
   (vi) testing said sub-assembly for electrical integrity.

24. The method of constructing a high performance printed circuit board assembly in accordance with claim 19, wherein said dielectric layer has a dielectric constant in a range approximately between 1.4 and 3.0.

25. The method of constructing a high performance printed circuit board assembly in accordance with claim 24, wherein said dielectric layer comprises polytetrafluoroethylene.

26. The method of constructing a high performance printed circuit board assembly in accordance with claim 21, wherein the laminating of the first and second cores together in step (iii) includes the use of a bonding film.

27. The method of constructing a high performance printed circuit board assembly in accordance with claim 21, wherein the laminating of the first and second cores together in step (iii) includes the use of a brominated epoxy resin.

28. The method of constructing a high performance printed circuit board assembly in accordance with claim 19, wherein the laminating step (c) comprises the use of a bonding film for laminating said sub-assemblies.

29. The method of constructing a high performance printed circuit board assembly in accordance with claim 19, wherein the laminating step (c) comprises the use of a brominated epoxy resin for laminating said sub-assemblies.

* * * * *